United States Patent
Jiang et al.

(10) Patent No.: US 9,502,571 B2
(45) Date of Patent: Nov. 22, 2016

(54) THIN FILM LAYER AND MANUFACTURING METHOD THEREOF, SUBSTRATE FOR DISPLAY AND LIQUID CRYSTAL DISPLAY

(71) Applicants: BOE TECHNOLOGY GROUP CO., LTD., Beijing (CN);
(Continued)

(72) Inventors: Qinghua Q Jiang, Beijing (CN);
Xiaohe Li, Beijing (CN)

(73) Assignees: BOE Technology Group Co., Ltd., Beijing (CN);
(Continued)

( * ) Notice: Subject to any disclaimer, the term of this patent is extended or adjusted under 35 U.S.C. 154(b) by 0 days.

(21) Appl. No.: 14/361,131

(22) PCT Filed: Jun. 19, 2013

(86) PCT No.: PCT/CN2013/077441
§ 371 (c)(1),
(2) Date: May 28, 2014

(87) PCT Pub. No.: WO2014/166162
PCT Pub. Date: Oct. 16, 2014

(65) Prior Publication Data
US 2015/0171209 A1 Jun. 18, 2015

(30) Foreign Application Priority Data
Apr. 11, 2013 (CN) .......................... 2013 1 0125065

(51) Int. Cl.
*H01L 29/786* (2006.01)
*C23C 14/14* (2006.01)
(Continued)

(52) U.S. Cl.
CPC ............ *H01L 29/786* (2013.01); *C23C 14/14* (2013.01); *C23C 14/3492* (2013.01);
(Continued)

(58) Field of Classification Search
CPC ............ H01L 29/786; H01L 21/02104; H01L 21/0217; H01L 21/022; H01L
(Continued)

(56) References Cited

U.S. PATENT DOCUMENTS 8,710,632 B2 * 4/2014 Yu .......................... C30B 25/165
257/655
2011/0186861 A1 * 8/2011 Malhan ................... H01L 29/12
257/77

FOREIGN PATENT DOCUMENTS

CN 202189209 U 4/2012
CN 102591006 A 7/2012
(Continued)

OTHER PUBLICATIONS

"Silicon Nitride Films by Reactive Sputtering" by Hu on J. Electrochem. Soc. Solid State Science, vol. 114, No. 8, Aug. 1967.*
(Continued)

*Primary Examiner* — Yasser A Abdelaziez
*Assistant Examiner* — Farun Lu
(74) *Attorney, Agent, or Firm* — Banner & Witcoff, Ltd.

(57) ABSTRACT

A thin film layer and manufacturing method thereof, a substrate for display and a liquid crystal display are provided. The embodiments according to the present invention can solve the problem that the gradient at the edge of the thin film layer produced with current methods is too steep or perpendicular, thus the thin film layer deposited in the next step easily has step coverage defect or even breakage. The thin film layer of the embodiments of the present invention comprises a plurality of sub-layers with different densities, (Continued)

wherein, the density of an upper sub-layer is smaller than that of a lower sub-layer. The yield and reliability of the thin film transistor and the thin film transistor liquid crystal display produced with the thin film layer of the embodiments of the present invention are high.

17 Claims, 3 Drawing Sheets

(71) Applicants: HEFEI BOE OPTOELECTRONICS TECHNOLOGY CO., LTD., Hefei, Anhui (CN)

(73) Assignees: HEFEI BOE Optoelectronics Technology Co., Ltd., Hefei (CN)

(51) Int. Cl.
| | |
|---|---|
| *C23C 14/34* | (2006.01) |
| *C23C 16/34* | (2006.01) |
| *C23C 16/455* | (2006.01) |
| *C23C 14/35* | (2006.01) |
| *H01L 21/02* | (2006.01) |
| *H01L 29/417* | (2006.01) |
| *H01L 29/423* | (2006.01) |
| *H01L 29/45* | (2006.01) |
| *H01L 29/49* | (2006.01) |
| *H01L 29/66* | (2006.01) |
| *H01L 21/311* | (2006.01) |
| *H01L 21/3205* | (2006.01) |
| *H01L 21/3213* | (2006.01) |

(52) U.S. Cl.
CPC ............ *C23C 14/35* (2013.01); *C23C 16/345* (2013.01); *C23C 16/45523* (2013.01); *H01L 21/022* (2013.01); *H01L 21/0217* (2013.01); *H01L 21/02104* (2013.01); *H01L 21/02274* (2013.01); *H01L 21/31116* (2013.01); *H01L 21/32051* (2013.01); *H01L 21/32134* (2013.01); *H01L 29/41733* (2013.01); *H01L 29/42384* (2013.01); *H01L 29/45* (2013.01); *H01L 29/458* (2013.01); *H01L 29/4908* (2013.01); *H01L 29/66757* (2013.01); *H01L 29/66969* (2013.01); *H01L 29/7869* (2013.01); *H01L 29/78696* (2013.01); *H01L 2029/42388* (2013.01); *Y10T 428/24992* (2015.01)

(58) Field of Classification Search
CPC ............ 21/02274;H01L 21/31116; H01L 21/32051; H01L 21/32134; C23C 14/35;C23C 14/14; C23C 14/3492; C23C 16/345; C23C 16/45523; Y10T 428/24992

See application file for complete search history.

(56) References Cited

FOREIGN PATENT DOCUMENTS

| | | | |
|---|---|---|---|
| CN | 102800632 A | 11/2012 | |
| CN | 202189209 U | * 4/2013 | ............ H01L 23/00 |

OTHER PUBLICATIONS

"Development of low temperature PECVD nitride with low stress and low etch rate in BOE solution for MEMS applications" by Ho on Defense Science Research Conference and Expo (DSR), 2011.*
"Formation of polycrystalline SiGe thin films by the RF magnetron sputtering method with Ar-H2 mixture gases" by Nakamura et al. on Vacuum 80 (2006) 712-715.*
Schaffler F., In Properties of Advanced SemiconductorMaterials GaN, AlN, InN, BN, SiC, SiGe . Eds. Levinshtein M.E., Rumyantsev S.L., Shur M.S., John Wiley & Sons, Inc., New York, 2001, 149-188.*
"Formation of polycrystalline SiGe thin films by the RF magnetron sputtering method with Ar—H2 mixture gases" by Nakamura et al. on Vacuum 80 (2006) 712-715.*
"Improvement of PECVD Silicon-Germanium Crystallization for CMOS Compatible MEMS Applications" by Guo et al. on Journal of the Electrochemical Society, 157 (2) D103-D110 (2010).*
International Search Report for International Application No. PCT/CN2013/077441, 12pgs.
English abstract of CN 202189209U, listed above, 1 page.
First Office Action (Chinese language) issued by the State Intellectual Property Office ("SIPO") on Sep. 30, 2014, for application No. 201310125065.4, 8 pages.
English translation of first Office Action issued by SIPO for application No. 201310125065.4, 9 pages.
Second Office Action (Chinese language) issued by the State Intellectual Property Office ("SIPO") on Mar. 9, 2015, for priority patent application No. 201310125065.4, 5 pages.
English translation of second Office Action issued by SIPO for priority patent application No. 201310125065.4, 8 pages.
Jul. 6, 2015—(CN)—Third Office Action for Appn 2013101250654 with Eng Tran.
Oct. 13, 2015—International Preliminary Report on Patentability Appn PCT/CN2013/077441.

* cited by examiner

THIN FILM LAYER AND MANUFACTURING METHOD THEREOF, SUBSTRATE FOR DISPLAY AND LIQUID CRYSTAL DISPLAY

CROSS REFERENCE TO RELATED APPLICATIONS

This application is based on International Application No. PCT/CN2013/077441 filed on Jun. 19, 2013, which claims priority to Chinese National Application No. 201310125065.4 filed on Apr. 11, 2013. The entire contents of each and every foregoing application are incorporated herein by reference.

TECHNICAL FIELD

Embodiments of the present invention relate to a thin film layer and a manufacturing method thereof, a substrate for display comprising the thin film layer, and a liquid crystal display comprising the substrate for display.

BACKGROUND

In a thin film transistor liquid crystal display (TFT-LCD), the yield of the production process of the TFT which is a core part of the display, directly decides the cost and reliability of the TFT-LCD. For current production processes of the LCD, the preparations of the respective film layers of the TFT are key steps. The size of the gradient at the edge of a thin film layer directly affects the performance of the coverage of the thin film layer deposited in the next step, when the gradient at the edge of a thin film is too steep or perpendicular, this will usually lead to the coverage defect or breakage of the thin film layer deposited in the next step; if the gradient at the edge of the thin film is gentle, the situations of coverage defect or breakage can be avoided to a large extent, thus the control over the gradient at the edge of the thin film layer is a key step in the TFT process.

In current TFT-LCD processes, identical process parameters are used for the production of each film layer, thus the crystallinity and density of each thin film layer are consistent, as illustrated in FIG. 1, the thin film layer 2 is produced on the substrate 3, and the crystallinity and the density of the formed thin film layer 2 are uniform and consistent, when coated photoresist 1 is exposed, during etching, the etching speeds of identical acid concentration (wet etching) or plasma strength (dry etching) to the thin film layer 2 will also be substantially identical, and the effect after the etching is illustrated in FIG. 2, and the gradient at the edge of the thin film layer 2 is relatively steep, which does not help the deposition of the thin film layer 4 in the next process and easily leads to step coverage defect or even breakage, as illustrated in FIG. 3.

SUMMARY

One of the purposes of the present invention is to solve the problem that the gradient at the edge of the thin film layer produced with current methods is too steep or perpendicular, thus the thin film layer deposited in the next step easily has step coverage defect or even breakage, and then to provide a thin film layer with fine coverage.

An embodiment of the present invention provides a thin film layer comprising a plurality of sub-layers with different densities, wherein, an upper sub-layer has a density smaller than that of a lower sub-layer.

In an example, each sub-layer of the thin film layer has a thickness of 1 nm-500 nm.

In an example, the thickness of each sub-layer of the thin film layer is 10 nm-50 nm.

In an example, each of the sub-layers of the thin film layer has a same thickness.

In an example, the number of sub-layers of the thin film layer is at least 3.

In an example, the thin film layer is any of an aluminum layer, a copper layer, an indium tin oxide layer, a zinc oxide layer, a SiNx layer and a SiOx layer.

In an example, materials of the sub-layers of the thin film layer are identical.

Another embodiment of the present invention provides a manufacturing method of the thin film layer, comprising:

setting initial process conditions, and forming an initial sub-layer of the thin film layer;

according to influence of changes of each process condition on a density of the thin film layer, adjusting at least one process condition, and forming at least two subsequent sub-layers which are based on the initial sub-layer and densities of which decrease sequentially according to an arrangement order.

In an example, setting the initial process conditions comprise: setting an initial magnetron sputtering power, gas flow, generation temperature, sputtering pressure and target base spacing.

Adjusting the at least one process condition according to the influence of the changes of each process condition on the density of the thin film layer and forming at least two subsequent sub-layers which are based on the initial sub-layers and densities of which decrease sequentially according to an arrangement order comprises:

using an adjustment manner of lowering the magnetron sputtering power and/or lowering gas flow to form a second sub-layer; and using an adjustment manner of lowering magnetron sputtering power and/or lowering gas flow to form one or a plurality of subsequent sub-layers.

In an example, setting the initial process conditions comprises: setting an initial plasma power, gas flow and generation temperature.

Adjusting the at least one process condition according to the influence of the changes of each process condition on the density of the thin film layer and forming at least two subsequent sub-layers which are based on the initial sub-layers and densities of which decrease sequentially according to an arrangement order comprises:

using an adjustment manner of lowering the plasmas power and/or lowering gas flow to form the second sub-layer; and using an adjustment manner of lowering the plasma power and/or lowering gas flow to form the one or a plurality of subsequent sub-layers.

Still another embodiment of the present invention provides a thin film transistor, comprising: at least one of the above thin film layers.

In an example, the at least one thin film layer is at least one of a gate insulating layer, an active layer and a source/drain electrode layer of the thin film transistor.

Still another embodiment of the present invention provides a substrate for display, comprising: a substrate and a plurality of pixel structures provided on the substrate; wherein, the pixel structure comprises at least one of the above thin film layers.

In an example, the substrate for display is an array substrate, and the one thin film layer in each pixel structure is a gate insulating layer or a passivation layer.

Still another embodiment of the present invention provides a liquid crystal display, comprising the above substrate for display.

For the thin film layers provided by the embodiments of the present invention, as each thin film layer has a plurality of sub-layers with different densities, during subsequent etching, under identical acid liquid concentration or plasma strength, the etching speeds of each of the sub-layers are different, the etching speed is in inverse ratio to the density, after the same etching period, different etching lengths lead to gentle gradient at the edge of the thin film layers. As the gradient at the edge of the thin film layers is gentle, the thin film layer in the next procedure is fine and does not have breakage.

The yield and reliability of the liquid crystal display produced with the method of the present invention are high.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

This embodiment provides a thin film layer comprising a plurality of sub-layers with different densities, wherein, the density of an upper sub-layer is smaller than that of a lower sub-layer.

Embodiment 2

This embodiment provides a manufacturing method of a thin film layer, and a thin film transistor comprising the thin film layer.

1) Using magnetron sputtering to form a thin film layer with sub-layers having different densities.

Figure 1:
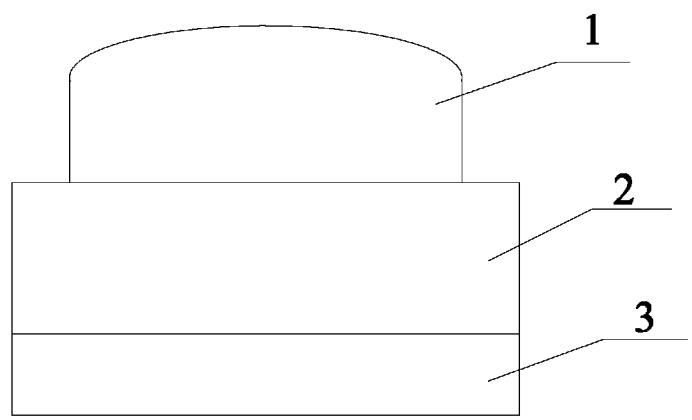
FIG. 1 is a schematic diagram of thin film layers before etching during the production of the thin film layers of a thin film transistor in the prior art.
Figure 2:
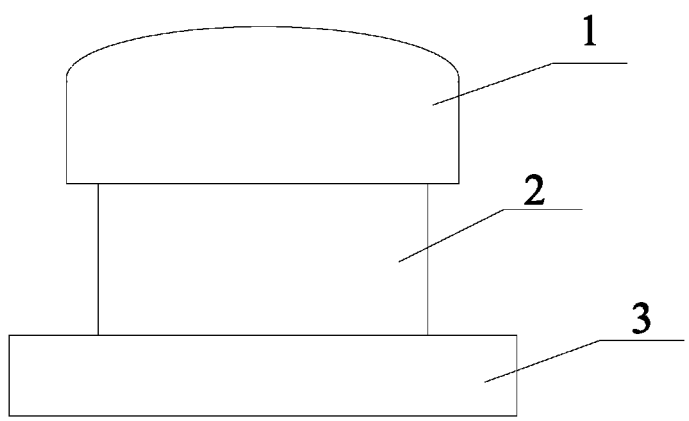
FIG. 2 is a schematic diagram of thin film layers after etching during the production of the thin film layers of the thin film transistor in the prior art.
Figure 3:
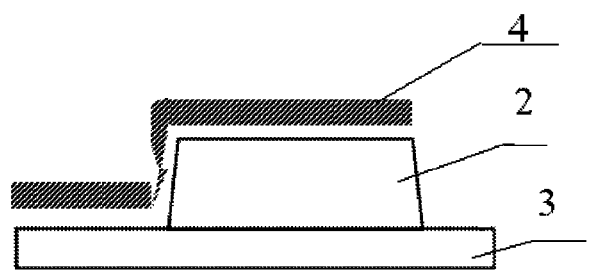
FIG. 3 is a schematic diagram of thin film layers after coverage in the next procedure during the production of the thin film layers of the thin film transistor in the prior art.
Figure 4:
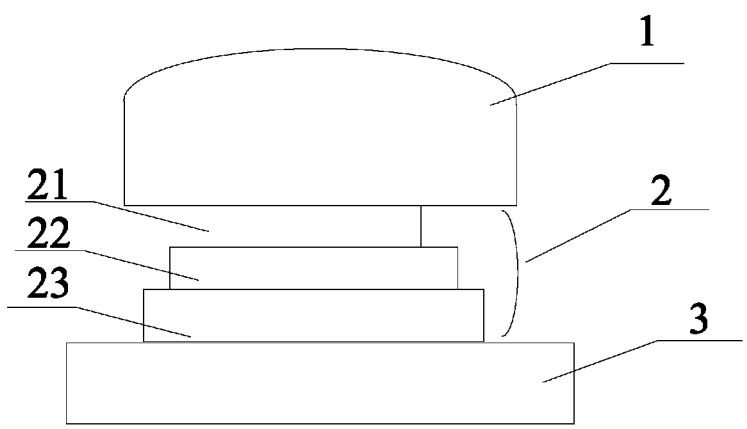
FIG. 4 is a schematic diagram of thin film layers before etching during the production of the thin film layers of a thin film transistor in embodiment 1 of the present invention.

A glass substrate is placed in a magnetron sputtering chamber, and through controlling the direct current sputtering power of a magnetron sputtering device to be 80 KW, Ar flow to be 900 sccm, sputtering pressure to be 0.3 pa, target base spacing to be 60 mm, substrate temperature (generation temperature) to be 200° C. and deposition period to be 20 s, an Al thin film layer with a large density and a thickness of 70 nm is formed, that is, as illustrated in FIG. 4, the part 23 of the thin film layer with a large density;

Then, through adjusting the above magnetron sputtering parameters, i.e., the direct current sputtering power to be 75 KW, Ar flow to be 800 sccm, sputtering pressure to be 0.3 pa, target base spacing to be 60 mm, substrate temperature to be 200° C. and deposition period to be 18 s, an Al thin film layer with a moderate density and a thickness of 50 nm is formed, that is, as illustrated in FIG. 4, the part 22 of the thin film layer with a moderate density; and finally, through adjusting the above magnetron sputtering parameters, i.e., the direct current sputtering power to be 70 KW, Ar flow to be 800 sccm, sputtering pressure to be 0.3 pa, target base spacing to be 60 mm, substrate temperature to be 200° C. and deposition period to be 15 s, an Al thin film layer with a small density and a thickness of 30 nm is formed, that is, as illustrated in FIG. 4, the part 21 of the thin film layer with a small density.

In this way, the Al thin film layer is constituted by 3 layers with different densities which decrease from the substrate to one side. For example, the thin film layer can be divided into more sub-layers according to the actual thickness of the thin film layer, which helps to form a more gentle edge gradient.

It should be understandable that the above magnetron sputtering device can also be selected to be other types according to specific purposes, and the control parameters can be adjusted depending on the materials of the target and the thicknesses of the sub-layers, which shall fall within the scope of the prior art.

It should be understandable that the above Al thin film layer can be any of other metal layers or metal oxide thin film layers, for example, copper layer, indium tin oxide layer and zinc oxide layer.

It should be understandable that the thicknesses of sub-layers can be selected according to practical application needs, for example, the thicknesses of the sub-layers of the thin film layer can be 1 nm-500 nm, and preferably, the thicknesses of the sub-layers of the thin film layer can also be 10 nm-50 nm.

For example, the thicknesses of the sub-layers of the Al thin film layer can be the same, which helps to form a relatively gentle edge gradient.

For example, the number of the sub-layers of the Al thin film layer is at least 3, which helps to form a relatively gentle edge gradient.

2) Coating photoresist 1 to the above produced Al thin film layer with sub-layers having different densities, and completing an exposing step.

3) Wet etching the produced Al thin film layer with sub-layers having different densities.

Figure 5:
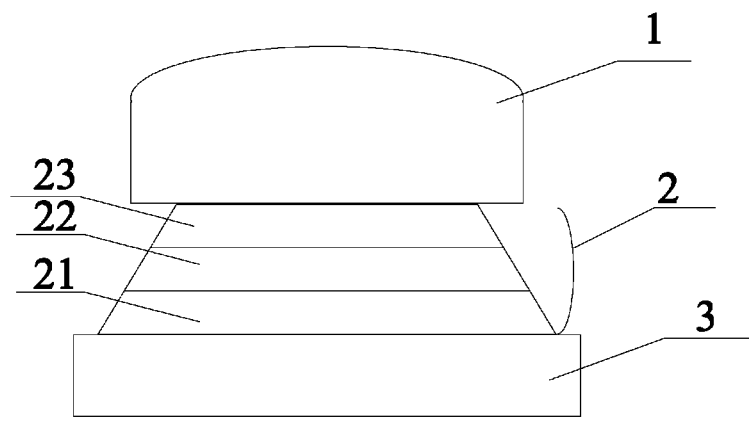
FIG. 5 is a schematic diagram of the thin film layers after etching during the production of the thin film layers of the thin film transistor in embodiment 1 of the present invention.

For example, the etching liquid is a mixture of phosphoric acid, nitric acid and acetic acid, and the amount-of-substance concentration of the three is 69:10:2.5, and the vibration speed of the glass substrate in the etching liquid is 3000 mm/min and the etching period is 15 s. The etching speeds of the respective sub-layers of the above Al thin film layer with sub-layers having different densities in an acid solution are different, and the etching speed is in inverse ratio to the density, after the same etching period, the etching lengths are different, and the edge gradient of the thin film layer as illustrated in FIG. 5 is obtained.

Figure 6:
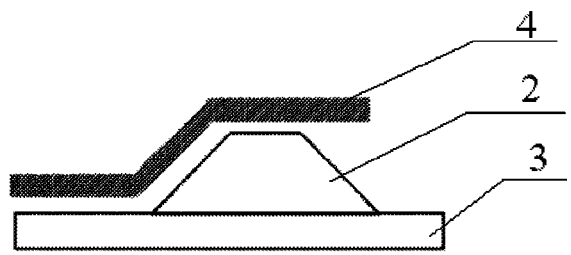
FIG. 6 is a schematic diagram of the thin film layers after coverage in the next procedure during the production of the thin film layers of the thin film transistor in embodiment 1 of the present invention.

4) Executing the step of removing the photoresist, and conducting the next procedure of production according to the above method, as the gradient at the edge of the thin film layer is gentle, at this moment, the coverage of the thin film layer in the next procedure is fine, as illustrated in FIG. 6, the Al thin film layer as the gate electrode layer of the thin film transistor is obtained.

Other necessary structure layers of the thin film transistor are produced through repeating the above composition method, for example, the gate insulating layer, the active layer, an ohmic contact layer, a source electrode, a drain electrode layer and etc., and then the thin film transistor is obtained. Of course, the specific materials, process parameters and etc. of the thin films of different layers are different; meanwhile, conventional methods can be used to produce layer structures that will not generate poor step coverage (that is, the deposited thin film has a uniform density and does not have density gradient).

Of course, the composition method in this embodiment is not limited to produce the layer structures in the thin film transistor, and can also be used to produce other structures.

Embodiment 3

This embodiment provides a manufacturing method of a thin film layer comprising the thin film transistor of the thin film layer.

1) Using a plasma enhanced chemical vapor deposition method to form the thin film layer with sub-layers have different densities.

A glass substrate is placed in a deposition chamber, and through controlling the plasma power to be 20 KW, $H_2$ flow to be 50000 sccm, $SiH_4$ flow to be 6000 sccm, $NH_3$ flow to be 20000 sccm, substrate temperature (generation temperature) to be 360° C. and deposition period to be 15 s, a SiNx layer with a large density and a thickness of 200 nm is formed;

then, through adjusting the above plasma power to be 18 KW, $H_2$ flow to be 48000 sccm, $SiH_4$ flow to be 5700 sccm, $NH_3$ flow to be 19500 sccm, substrate temperature to be 360° C. and deposition period to be 20 s, a SiNx layer with a moderate density and a thickness of 200 nm is formed; and finally, through adjusting the above plasma power to be 16 KW, $H_2$ flow to be 46000 sccm, $SiH_4$ flow to be 5500 sccm, $NH_3$ flow to be 18500 sccm, substrate temperature to be 360° C. and deposition period to be 20 s, a SiNx layer with a small density and a thickness of 200 nm is formed.

In this way, the SiNx layer is constituted by 3 layers with different densities which decrease from the substrate to one side. Preferably, the thin film layer can be divided into more sub-layers according to the actual thickness of the thin film layer, which helps to form a more gentle edge gradient.

It should be understandable that the above plasma enhanced chemical vapor deposition device can also be selected to be other types according to specific purposes, and the control parameters can be adjusted depending on the materials of the thin film and the thicknesses of the sub-layers.

It should be understandable that the above SiNx layer can be other nonmetallic thin film layer, for example, it can be SiOx layer.

It should be understandable that the thicknesses of sub-layers of the thin film layer can be selected according to practical application needs, for example, the thicknesses of the sub-layers of the thin film layer can be 1 nm-500 nm, and more preferably, the thicknesses of the sub-layers of the thin film layer can also be 10 nm-50 nm.

For example, the thicknesses of the sub-layers of the thin film layer can be the same, which helps to form a relatively gentle edge gradient.

For example, the number of the sub-layers of the thin film layer is at least 3, which helps to form a relatively gentle edge gradient.

2) Coating photoresist 1 to the above produced SiNx layer with sub-layers having different densities, and completing an exposing step.

3) Dry etching the produced SiNx layer with sub-layers having different densities.

For example, for the dry etching plasma etching device, the power is controlled to be 8 KW, the chamber pressure is controlled to be 50 mT, $SF_6$ flow is controlled to be 800 sccm, $O_2$ flow is controlled to be 10000 sccm, $Cl_2$ flow is controlled to be 7000 sccm, and the etching period is controlled to be 30 s. The etching speeds of the respective sub-layers of the above SiNx layer with sub-layers having different densities under the same plasma strength are different, and the etching speed is in inverse ratio to the density, after the same etching period, the etching lengths are different, and the edge gradient of the thin film layer similar to that illustrated in FIG. 5 can also be obtained.

4) Executing the step of removing the photoresist, and conducting the next procedure of production according to the above method, as the gradient at the edge of the thin film layer is gentle, at this moment, the coverage of the thin film layer in the next procedure is fine;

Other necessary structure layers of the thin film transistor are produced through repeating the above composition method, for example, the gate insulating layer, the active layer, an ohmic contact layer, a source electrode, a drain electrode layer and etc., and then the thin film transistor is obtained. Of course, the specific materials, process parameters and etc. of the thin films of different layers are different; meanwhile, conventional methods can be used to produce layer structures that will not generate poor step coverage (that is, the deposited thin film has a uniform density and does not have density gradient).

Of course, the patterning method in this embodiment is not limited to produce the layer structures in the thin film transistor, and can also be used to produce other structures.

In the above embodiments, for example, the materials of the sub-layers in each thin film layer are the same.

Embodiment 4

This embodiment provides a substrate for display, comprising: a substrate and a plurality of pixel structures provided on the substrate; the pixel structures comprise at least one of the above thin film layers.

For example, the substrate for display is an array substrate, and the one thin film layer in each pixel structure is a gate insulating layer.

For example, the substrate for display is an array substrate, and the one thin film layer in each pixel structure is a passivation layer.

Embodiment 5

This embodiment provides a liquid crystal display, comprising the above substrate for display.

Described above are just illustrative embodiments of the invention and are not intended to limit the scope of protection of the present invention, and the scope of protection of the present invention shall be defined by the claims appended herein.

The invention claimed is:

1. A thin film layer, comprising a plurality of sub-layers with different densities, wherein, an upper sub-layer has a density smaller than that of a lower sub-layer, and the thin film layer is at least one of an active layer and a source/drain electrode layer, and wherein the thin film layer is any of an aluminum layer, a copper layer, an indium tin oxide layer, and a zinc oxide layer.

2. The thin film layer according to claim 1, wherein, each sub-layer of the thin film layer has a thickness of 1 nm-500 nm.

3. The thin film layer according to claim 2, wherein, the thickness of each sub-layer of the thin film layer is 10 nm-50 nm.

4. The thin film layer according to claim 1, wherein, each of the sub-layers of the thin film layer has a same thickness.

5. The thin film layer according to claim 1, wherein, a number of the sub-layers of the thin film layer is at least 3.

6. The thin film layer according to claim 1, wherein, materials of the sub-layers of the thin film layer are identical.

7. A thin film transistor comprising at least one thin film layer according to claim 1.

8. The thin film transistor according to claim 7, wherein, the at least one thin film layer is at least one of an active layer and a source/drain electrode layer of the thin film transistor.

9. The thin film layer according to claim 2, wherein, each of the sub-layers of the thin film layer has a same thickness.

10. The thin film layer according to claim 3, wherein, each of the sub-layers of the thin film layer has a same thickness.

11. The thin film layer according to claim 2, wherein, a number of the sub-layers of the thin film layer is at least 3.

12. The thin film layer according to claim 3, wherein, a number of the sub-layers of the thin film layer is at least 3.

13. The thin film layer according to claim 4, wherein, a number of the sub-layers of the thin film layer is at least 3.

14. The thin film layer according to claim 2, wherein, materials of the sub-layers of the thin film layer are identical.

15. A manufacturing method of a thin film layer, comprising:
   setting initial process conditions, and forming an initial sub-layer of the thin film layer; and
   according to influence of changes of each process condition on a density of the thin film layer, adjusting at least one process condition, and forming at least two subsequent sub-layers which are based on the initial sub-layer and densities of which decrease sequentially according to an arrangement order,
   wherein the thin film layer is at least one of an active layer and a source/drain electrode layer, and wherein the thin film layer is any of an aluminum layer, a copper layer, an indium tin oxide layer, and a zinc oxide layer.

16. The manufacturing method according to claim 15, wherein, setting the initial process conditions comprise: setting an initial magnetron sputtering power, gas flow, generation temperature, sputtering pressure and target base spacing, and
   adjusting the at least one process condition according to the influence of the changes of each process condition on the density of the thin film layer and forming at least two subsequent sub-layers which are based on the initial sub-layers and densities of which decrease sequentially according to an arrangement order comprises:
   using an adjustment manner of lowering the magnetron sputtering power and/or lowering gas flow to form a second sub-layer; and
   using an adjustment manner of lowering the magnetron sputtering power and/or lowering gas flow to form one or a plurality of subsequent sub-layers.

17. The manufacturing method according to claim 15, wherein, setting the initial process conditions comprises: setting an initial plasma power, gas flow and generation temperature,
   adjusting the at least one process condition according to the influence of the changes of each process condition on the density of the thin film layer and forming at least two subsequent sub-layers which are based on the initial sub-layers and densities of which decrease sequentially according to an arrangement order comprises:
   using an adjustment manner of lowering the plasma power and/or lowering gas flow to form a second sub-layer; and
   using an adjustment manner of lowering the plasma power and/or lowering gas flow to form one or a plurality of subsequent sub-layers.

* * * * *